US010274770B2

(12) United States Patent
Wang et al.

(10) Patent No.: US 10,274,770 B2
(45) Date of Patent: Apr. 30, 2019

(54) DISPLAY MOTHER PANEL AND METHOD OF CUTTING THE SAME (71) Applicants: BOE TECHNOLOGY GROUP CO., LTD., Beijing (CN); Chengdu BOE Optoelectronics Technology Co., Ltd., Chengdu, Sichuan Province (CN)

(72) Inventors: Zhuo Wang, Beijing (CN); Jinhwan Hwang, Beijing (CN); Xiangnan Wang, Beijing (CN); Jinhao Huang, Beijing (CN); Yinhua Piao, Beijing (CN); Wenqiang Chen, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 255 days.

(21) Appl. No.: 14/542,818

(22) Filed: Nov. 17, 2014

(65) Prior Publication Data

US 2015/0327361 A1    Nov. 12, 2015

(30) Foreign Application Priority Data

May 9, 2014    (CN) .......................... 2014 1 0194342

(51) Int. Cl.
G02F 1/1333    (2006.01)
G02F 1/1339    (2006.01)
(Continued)

(52) U.S. Cl.
CPC ...... *G02F 1/133351* (2013.01); *G02F 1/1339* (2013.01); *H05K 1/0296* (2013.01);
(Continued)

(58) Field of Classification Search
CPC ............. G02F 1/133351; G02F 1/1339; G02F 1/133512; G02F 1/13336; G02F 1/1347;
(Continued)

(56) References Cited

U.S. PATENT DOCUMENTS 6,195,149 B1 * 2/2001 Kodera ............. G02F 1/133351
                                                            349/187
7,830,490 B2 * 11/2010 Park ..................... G02F 1/1341
                                                            349/110
(Continued)

FOREIGN PATENT DOCUMENTS

CN        1166880 A      12/1997
CN      101276083 A      10/2008
(Continued)

OTHER PUBLICATIONS

Jiang et al., "The Display Panel Main Board and Manufacturing Method", Jul. 17, 2013, Machine Translation of CN103207480A from USPTO Global Patent Search Network, All pages.*

(Continued)

*Primary Examiner* — Shan Liu
(74) *Attorney, Agent, or Firm* — Nath, Goldberg & Meyer; Joshua B. Goldberg (57) ABSTRACT The embodiments of the present invention provide a display mother panel to be divided into a plurality of display panels. A sealing agent is provided around a display region of each display panel, the sealing agents provided between adjacent longitudinal edges of the display regions of two adjacent display panels in a same row are formed integrally, and a first black matrix is provided on the sealing agents provided between the adjacent longitudinal edges of the display regions of the two adjacent display panels. The embodiments of the present invention also provide a method of cutting the display mother panel. The display mother panel may be easily cut into the plurality of display panels by (Continued)

cutting the display mother panel using the method according to the embodiments of the present invention, and each display panel has a relatively large display area.

7 Claims, 6 Drawing Sheets (51) Int. Cl.
  *H05K 1/02* (2006.01)
  *H05K 3/00* (2006.01)
  *G02F 1/1335* (2006.01)
(52) U.S. Cl.
  CPC ..... *H05K 3/0052* (2013.01); *G02F 1/133512* (2013.01); *H05K 2201/10128* (2013.01); *H05K 2203/0228* (2013.01); *Y10T 83/0207* (2015.04); *Y10T 428/192* (2015.01)
(58) Field of Classification Search
  CPC .... G02F 1/1303; G02F 1/0107; G02F 1/1341; G02F 1/161; G02F 1/133514; G02F 1/136209; G02F 1/13473; G02F 1/133371; G02F 2001/136222; G02F 2001/136218; H05K 1/0296; H05K 3/0052; H05K 2201/10128; H05K 2203/0228; Y10T 428/192; Y10T 83/0207; H01J 11/44; H01J 2211/444; H01J 2329/323; H01J 29/327
  USPC ...................... 349/73, 74, 187, 153, 106–111
  See application file for complete search history.

(56) References Cited

U.S. PATENT DOCUMENTS

| | | | | |
|---|---|---|---|---|
| 8,054,438 B2* | 11/2011 | Lee | ................... | G02F 1/133351 313/512 |
| 8,786,816 B2* | 7/2014 | Kim | ...................... | G02F 1/1339 349/153 |
| 2001/0015786 A1* | 8/2001 | Katsura | ................. | G02F 1/1339 349/153 |
| 2005/0110937 A1* | 5/2005 | Yoon | ................... | G02F 1/13394 349/153 |
| 2007/0273821 A1* | 11/2007 | Liou | ..................... | G02F 1/1339 349/153 |
| 2008/0198287 A1* | 8/2008 | Kim | .................... | G02F 1/13454 349/42 |
| 2010/0045921 A1 | 2/2010 | Wang et al. | | |
| 2011/0104975 A1* | 5/2011 | Yamagishi | ............ | C03B 33/076 445/25 |
| 2012/0224133 A1* | 9/2012 | Makino | ............ | G02F 1/133351 349/153 |
| 2013/0235319 A1* | 9/2013 | Tsuchiya | ............... | G02F 1/1339 349/153 |
| 2014/0055735 A1* | 2/2014 | Oono | ................. | G02F 1/13394 349/153 |
| 2014/0071389 A1* | 3/2014 | Daishi | ............... | G02F 1/133345 349/123 |
| 2014/0300848 A1* | 10/2014 | Mori | ..................... | G02F 1/1339 349/106 |
| 2015/0309349 A1* | 10/2015 | Hatakeyama | ......... | G02F 1/1339 349/122 |
| 2016/0202547 A1* | 7/2016 | Tatemura | .......... | G02F 1/133512 349/43 |

FOREIGN PATENT DOCUMENTS

| | | |
|---|---|---|
| CN | 102200663 A | 9/2011 |
| CN | 103207480 A | 7/2013 |
| JP | 2009300475 A | 12/2009 |

OTHER PUBLICATIONS

Office Action dated Apr. 27, 2016 issued in corresponding Chinese Application No. 201410194342.1.
Third Office Action dated Jun. 1, 2017 in corresponding Chinese Patent Application No. 201410194342.1.

* cited by examiner

DISPLAY MOTHER PANEL AND METHOD OF CUTTING THE SAME

CROSS-REFERENCE TO RELATED APPLICATION

This application claims priority under 35 U.S.C. § 119 to Chinese Patent Application No. 201410194342.1, filed on May 9, 2014, in the Chinese Intellectual Property Office, the disclosure of which is incorporated by reference herein in its entirety.

FIELD OF THE INVENTION

The present invention relates to fabrication of display panel, and more particularly, to a display mother panel and a method of cutting the display mother panel.

BACKGROUND OF THE INVENTION

Figure 1:
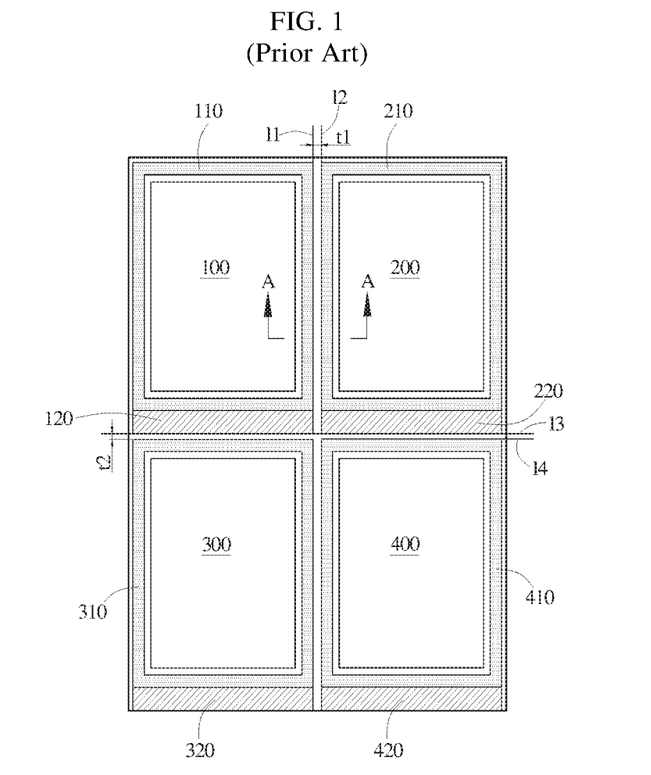
FIG. 1 is a top view schematic diagram of a display mother panel in the prior art.
Figure 2:
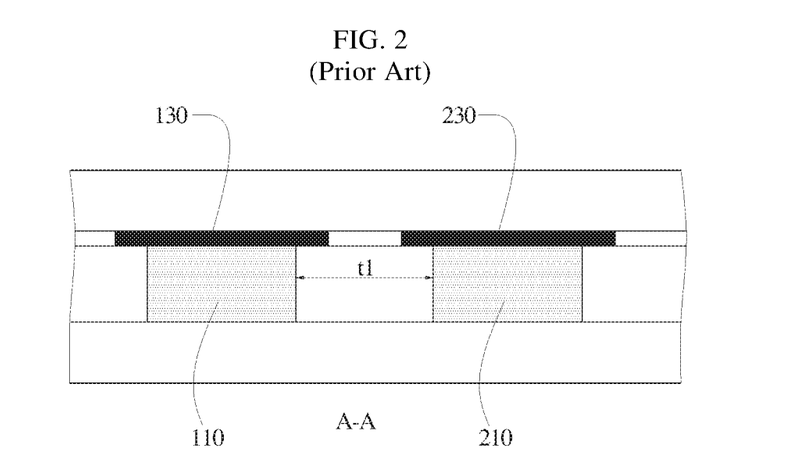
FIG. 2 is a cross-sectional view taken along a line A-A of FIG. 1.

FIG. 1 illustrates a top view schematic diagram of a display mother panel, and FIG. 2 is a cross-sectional view taken along a line A-A of FIG. 1. A first display panel 100, a second display panel 200, a third display panel 300 and a fourth display panel 400 may be obtained by cutting the display mother panel.

As shown in FIGS. 1 and 2, the first display panel 100 comprises a first display region, a first sealing agent 110 provided to surround the first display region, a first electrode terminal region 120 provided at an end of the first sealing agent 110, and a first black matrix 130 provided above the first sealing agent 110. The second display panel 200 comprises a second display region, a second sealing agent 210 provided to surround the second display region, a second electrode terminal region 220 provided at an end of the second sealing agent 210, and a second black matrix 230 provided above the second sealing agent 210. Similarly, the third display panel 300 comprises a third display region, a third sealing agent 310 provided to surround the third display region, a third electrode terminal region 320 provided at an end of the third sealing agent 310, and a third black matrix (not illustrated in drawings) provided above the third sealing agent 310. The fourth display panel 400 comprises a fourth display region, a fourth sealing agent 410 provided to surround the fourth display region, a fourth electrode terminal region 420 provided at an end of the fourth sealing agent 410, and a fourth black matrix (not illustrated in drawings) provided above the fourth sealing agent 410.

Generally, the display mother panel shown in FIG. 1 is cut into the first display panel 100, the second display panel 200, the third display panel 300 and the fourth display panel 400 by a cutting method using a mechanical cutter wheel. In order to prevent cracks formed while cutting the panel from affecting the display region, the cutting is generally performed along cutting lines 11, 12, 13 and 14. A cutting space with a width of t1 is formed between the cutting line 11 and the cutting line 12, and a cutting space with a width of t2 is formed between the cutting line 13 and the cutting line 14.

As can be seen from the above, the cutting spaces are required to be provided on the display mother panel in the prior art, and the display regions of the display panels are reduced, which does not facilitate fabrication of display device with large screen and narrow border.

Therefore, how to obtain the display device with large screen and narrow border becomes the technical problem to be solved in the art.

SUMMARY OF THE INVENTION

The objective of the present invention is to provide a display mother panel and a method of cutting the display mother panel, a display panel with large screen and narrow border may be obtained by cutting the display mother panel using the cutting method.

As an aspect of the present invention, the embodiments of the present invention provide a display mother panel, the display mother panel is divided into a plurality of display panels, and a sealing agent is provided around a display region of each display panel; the sealing agents provided between adjacent longitudinal edges of the display regions of two adjacent display panels in a same row are formed integrally, and a first black matrix is provided on the sealing agents provided between the adjacent longitudinal edges of the display regions of the two adjacent display panels.

In some embodiments, the display mother panel further comprises a plurality of electrode terminal regions, each display panel corresponds to one electrode terminal region, a row of the display regions of the display panels are provided between two adjacent rows of electrode terminal regions; and the sealing agent is provided at a side of the electrode terminal region close to the display region of the display panel corresponding to the electrode terminal region, and a first space region is provided at the other side of the electrode terminal region.

In other embodiments, the display mother panel further comprises a plurality of electrode terminal regions, each display panel corresponds to one electrode terminal region, the electrode terminal regions corresponding to one row of the display panels are provided at a side of the display regions of the one row of the display panels, and another row of the display panels are provided at the other side of the display regions of the one row of the display panels; the sealing agents provided between adjacent transverse edges of the display regions of two adjacent rows of the display panels are formed integrally, and a second black matrix is provide on the sealing agents provided between the adjacent transverse edges of the display regions of the two adjacent rows of the display panels; and the sealing agent is provided at a side of the electrode terminal region close to the display region of the display panel corresponding to the electrode terminal region, and a second space region is provided at the other side of the electrode terminal region.

The display mother panel further comprises a dummy region provided adjacent to at least one of the display panels, the dummy region comprises the sealing agent surrounding the dummy region, the sealing agents provided at a junction of the dummy region and the display panel are formed integrally, and a third black matrix is provided on the sealing agents provided at the junction of the dummy region and the display panel.

As another aspect of the present invention, the embodiments of the present invention provide a method of cutting the display mother panel described above, comprising steps of: forming a first trench in the first black matrix, a length of the first trench being equal to that of the first black matrix; cutting a first substrate of the display mother panel at a position corresponding to the first trench, at a side of the display mother panel; and cutting a second substrate of the display mother panel at a position corresponding to the first trench, at an opposite side of the display mother panel.

The first black matrix is formed integrally, and the first trench is formed by using a laser cutting.

In some embodiments, the display mother panel further comprises a plurality of electrode terminal regions, each display panel corresponds to one electrode terminal region, and a row of the display regions of the display panels are provided between two adjacent rows of electrode terminal regions; the sealing agent is provided at a side of the electrode terminal region close to the display region of the display panel corresponding to the electrode terminal region, and a first space region is provided at the other side of the electrode terminal region. And the method further comprises steps of: cutting the display mother panel along edges of the electrode terminal regions adjacent to the first space region, at a side of the display mother panel; and cutting the display mother panel along the edges of the electrode terminal regions adjacent to the first space region, at an opposite side of the display mother panel.

In other embodiments, the display mother panel further comprises a plurality of electrode terminal regions, each display panel corresponds to one electrode terminal region, the electrode terminal regions corresponding to one row of the display panels are provided at a side of the display regions of the one row of the display panels, and another row of the display panels are provided at the other side of the display regions of the one row of the display panels; the sealing agents provided between adjacent transverse edges of the display regions of two adjacent rows of the display panels are formed integrally, and a second black matrix is provide on the sealing agents provided between the adjacent transverse edges of the display regions of the two adjacent rows of the display panels; and the sealing agent is provided at a side of the electrode terminal region close to the display region of the display panel corresponding to the electrode terminal region, and a second space region is provided at the other side of the electrode terminal region. And the method further comprises steps of: forming a second trench in the second black matrix, extending direction of the second trench being the same as that of the electrode terminal region; cutting the first substrate at a position corresponding to the second trench and cutting the first substrate along edges of the electrode terminal regions adjacent to the second space region, at a side of the display mother panel; and cutting the second substrate at a position corresponding to the second trench and cutting the second substrate along the edges of the electrode terminal regions adjacent to the second space region, at an opposite side of the display mother panel.

The second black matrix is formed integrally, and the second trench is formed by using a laser cutting.

In the above method, the display mother panel further comprises a dummy region provided adjacent to at least one of the display panels, the dummy region comprises the sealing agent surrounding the dummy region, the sealing agents provided at a junction of the dummy region and the display panel are formed integrally, and a third black matrix is provided on the sealing agents provided at the junction of the dummy region and the display panel, and the method further comprises steps of: forming a third trench in the third black matrix, extending direction of the third trench being the same as length direction of the sealing agents provided at the junction of the dummy region and the display panel; cutting the first substrate at a position corresponding to the third trench, at a side of the display mother panel; and cutting the second substrate at a position corresponding to the third trench, at an opposite side of the display panel.

The third black matrix is formed integrally, and the third trench is formed by using a laser cutting.

In the display mother panel according to the embodiments of the present invention, the cutting spaces are omitted, and thus each of the display panels on the display mother panel may have a larger display area and a narrower border. In the cutting method according to the embodiments of the present invention, the first trench formed below the first substrate facilitates propagation of cracks which are formed on the first substrate by using the mechanical cutter wheel, and facilitates separation of the display mother panel along cutting lines by using relatively small pressure, after forming the cutting lines on a surface and an opposite surface of the display mother panel. Therefore, the display mother panel may be easily cut into the plurality of display panels by cutting the display mother panel using the method according to the embodiments of the present invention.

BRIEF DESCRIPTION OF THE DRAWINGS

The drawings which constitute a part of the description are used for providing further understanding of the present invention and for explaining the present invention in conjunction with the following embodiments, but not for limiting the present invention. In the drawings.

DESCRIPTION OF THE PREFERRED EMBODIMENT

Hereinafter, the exemplary embodiments of the present invention will be described in detail with reference to the accompanying drawings. It should be understood that the specific embodiments described herein are only intended to illustrate and explain the present invention and are not intended to limit the present invention.

It should be understood that terms of orientations such as "on", "above" and "below" used in description refer to orientations of "on", "above" and "below" when a display mother panel is placed on a horizontal plane and a display surface of the display mother panel faces upward.

Figure 3:
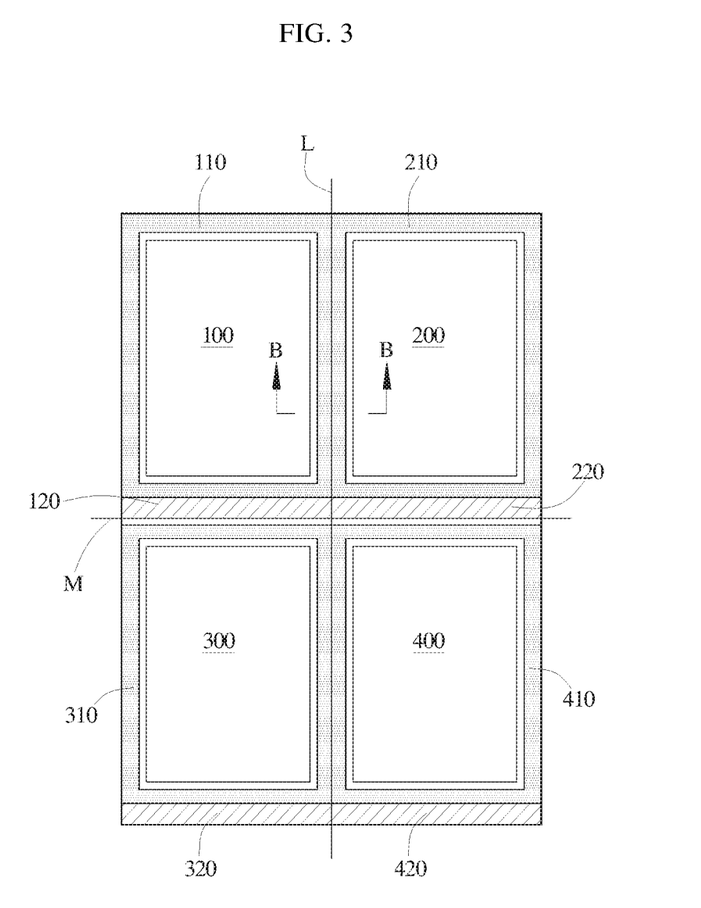
FIG. 3 is a structural schematic diagram of a display mother panel according to the embodiments of the present invention.
Figure 4:
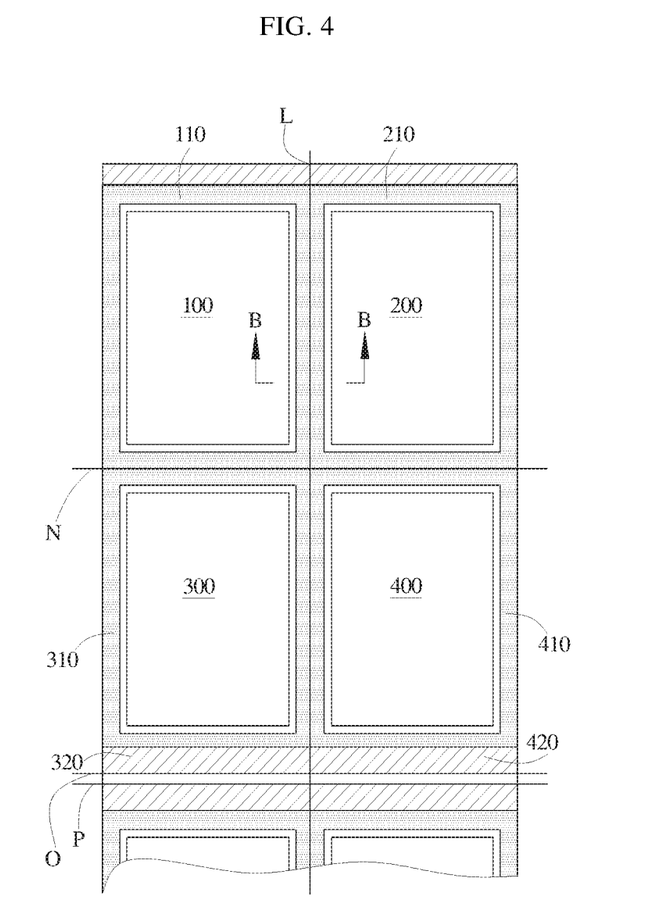
FIG. 4 is another structural schematic diagram of a display mother panel according to the embodiments of the present invention.
Figure 5:
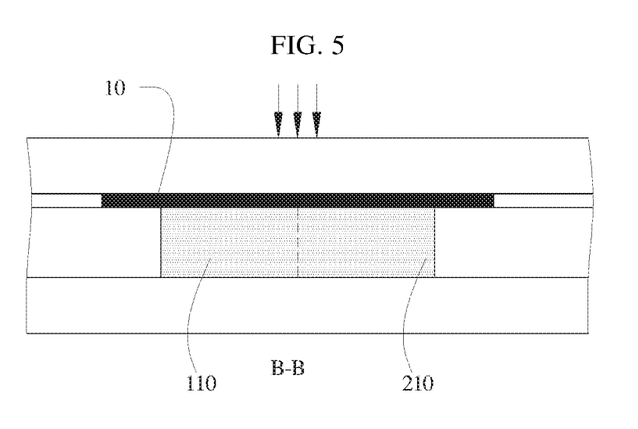
FIG. 5 is a cross-sectional view taken along a line B-B of FIGS. 3 and 4.

Referring to FIGS. 3 through 6, the embodiments of the present invention provide a display mother panel, the display mother panel is divided into a plurality of display panels, and a sealing agent is provided to surround a display region of each display panel. In two display panels adjacent to each other in the same row, the sealing agents provided between adjacent longitudinal edges of the display regions of the two adjacent display panels are formed integrally, and a first black matrix 10 is provided on the sealing agents provided between the adjacent longitudinal edges of the display regions of the two adjacent display panels (as shown in FIG. 5).

Since the sealing agent is provided between the adjacent longitudinal edges of the display regions of the two adjacent display panels and the cutting space is omitted, as compared with the prior art described in the background art, each display panel in the display mother panel according to the embodiments of the present invention may have a relatively large display region, so that display of large screen and narrow border may be obtained. The objective of providing the first black matrix is to first form a first trench in the first black matrix without destroying two substrates of the display mother panel when cutting the display mother panel, so as to facilitate propagation of cracks formed after the display mother panel is cut by using a mechanical cutter wheel, and facilitate separation of the display mother panel that has been cut by the mechanical cutter wheel, along a cutting line formed when the cutting is performed using the mechanical cutter wheel.

Specifically, as shown in FIGS. 3 and 4, the display panel comprises a first display panel 100, a second display panel 200, a third display panel 300 and a fourth display panel 400. As shown in the drawings, a first sealing agent 110 is provided around the display region of the first display panel 100, a second sealing agent 210 is provided around the display region of the second display panel 200, a third sealing agent 310 is provided around the display region of the third display panel 300, and a fourth sealing agent 410 is provided around the display region of the fourth display panel 400. A portion of the first sealing agent 110 provided between the display region of the first display panel 100 and the display region of the second display panel 200 and a portion of the second sealing agent 210 provided between the display region of the first display panel 100 and the display region of the second display panel 200 are formed integrally. A portion of the third sealing agent 310 provided between the display region of the third display panel 300 and the display region of the fourth display panel 400 and a portion of the fourth sealing agent 410 provided between the display region of the third display panel 300 and the display region of the fourth display panel 400 are formed integrally.

As shown in FIG. 5, the longitudinal edge of the first sealing agent 110 and the longitudinal edge of the second sealing agent 210 which are provided between the display region of the first display panel 100 and the display region of the second display panel 200 are formed integrally. The first black matrix 10 is provided on the longitudinal edge of the first sealing agent 110 and the longitudinal edge of the second sealing agent 210 which are formed integrally, and covers a portion of the longitudinal edge of the first sealing agent 110 and a portion of the longitudinal edge of the second sealing agent 210.

Figure 6:
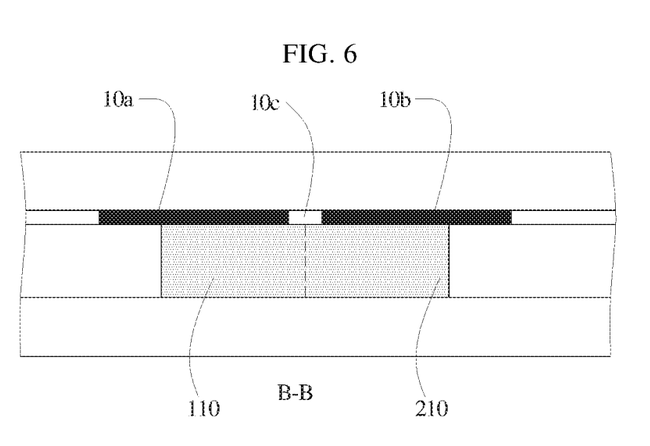
FIG. 6 is a cross-sectional view of the display mother panel in FIG. 5 after being subjected to a laser cutting.

As described above, the first trench may be first formed in the first black matrix 10 when cutting the display mother panel. In the embodiments of the present invention, as shown in FIG. 5, the first black matrix 10 may be an integrated structure, and the first trench may be first formed in the first black matrix 10 by using a laser cutting when cutting the display mother panel. Since material for forming the first black matrix (equivalent to material for fabricating the black matrix of the display panel in the prior art) has a relatively low thermal conductivity, if energy of the laser and a size of the light spot are well controlled when cutting the first black matrix by using the laser cutting, an amount of heat transferred to the inside of the display panel through the sealing agent provided below the first black matrix is relatively small, which may not produce much effect on the inside of the display panel. As shown in FIG. 6, after the laser cutting, the first trench 10c is formed in the first black matrix, and the first black matrix is formed as a first left black matrix 10a and a first right black matrix 10b.

In order to provide a driving circuit corresponding to each display panel, the display mother panel further comprises a plurality of electrode terminal regions, and each display panel corresponds to one electrode terminal region. As shown in FIGS. 3 and 4, the first display panel 100 corresponds to the first electrode terminal region 120, the second display panel 200 corresponds to the second electrode terminal region 220, the third display panel 300 corresponds to the third electrode terminal region 320, and the fourth display panel 400 corresponds to the fourth electrode terminal region 420.

In the display mother panel according to the embodiments of the present invention, the electrode terminal regions may be disposed in following two manners.

As shown in FIG. 3, the display regions of the display panels in one row may be provided between the two adjacent rows of the electrode terminal regions. The sealing agent is provided at one side of the electrode terminal region close to the display region of the display panel corresponding to the electrode terminal region, and a first space region is provided at the other side of the electrode terminal region. As shown in FIG. 3, the first space region is provide below the first electrode terminal region 120 ("below" used herein refers to a downward direction on the surface of paper), and the first space region may be considered as space between the two adjacent rows of the display panels. When transversely cutting the display mother panel shown in FIG. 3, the cutting is performed along an edge (i.e., the cutting line M in FIG. 3) of the electrode terminal region adjacent to the first space region.

As shown in FIG. 4, the electrode terminal regions corresponding to one row of the display panels may be provide at a side of the display regions of the one row of the display panels, and another row of the display panels may be provided at the other side of the display regions of the one row of the display panels. The sealing agents provided between adjacent transverse edges of the display regions of the two adjacent rows of the display panels are formed integrally, and a second black matrix is provide on the sealing agents provided between the adjacent transverse edges of the display regions of the two adjacent rows of the display panels. The sealing agent is provided at one side of the electrode terminal region close to the display region of the display panel corresponding to the electrode terminal region, and a second space region is provided at the other side of the electrode terminal region. As shown in FIG. 4, the second space region is provide below the third electrode terminal region 320 ("below" used herein refers to a downward direction on the surface of paper). The function of the second black matrix is similar to that of the first black matrix, which will be described later in detail, and description thereto is omitted herein.

The second black matrix may be formed integrally and cut by using the laser cutting, which is similar to the first black matrix.

Generally, the display mother panel further comprises a dummy region provided adjacent to at least one of the display panels. For example, the dummy region may be provided around the display panel. The dummy region comprises the sealing agent surrounding the dummy region, the sealing agents provided at a junction of the dummy region and the display panel are formed integrally, and a third black matrix is provided on the sealing agents provided at the junction of the dummy region and the display panel. The setting position of the dummy region is well known to persons skilled in the art, and description thereto is omitted herein. The objective of providing the third black matrix is similar to that of providing the first black matrix and the second black matrix, and description thereto is also omitted herein.

Similarly, the third black matrix may be formed integrally and cut by using the laser cutting, which is similar to the first black matrix and the second black matrix.

Figure 7:
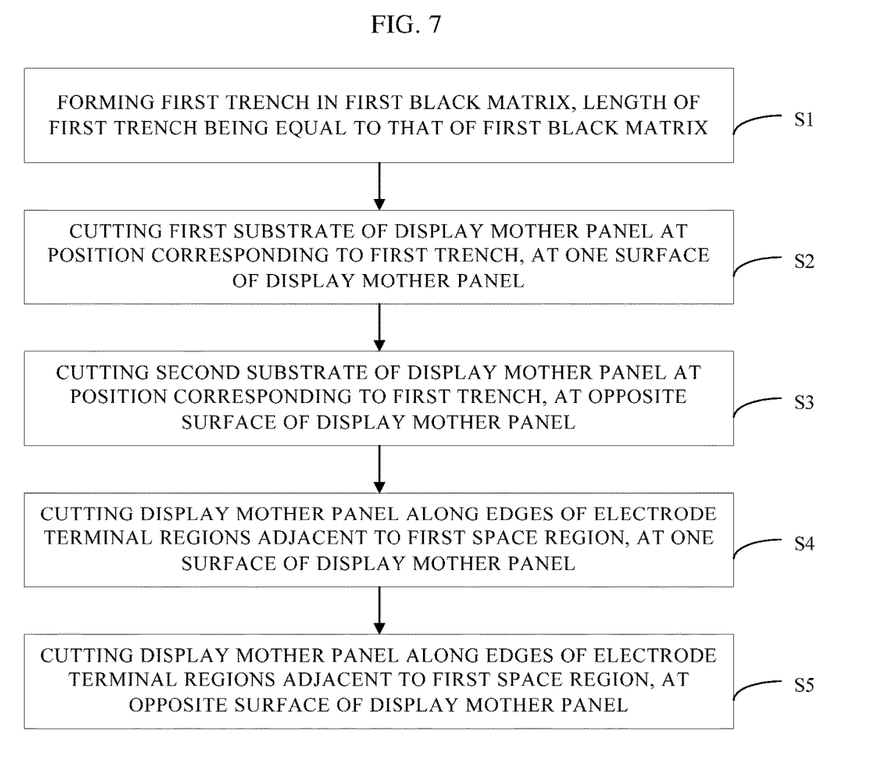
FIG. 7 is a flowchart of a cutting method according to the embodiments of the present invention.
Figure 8:
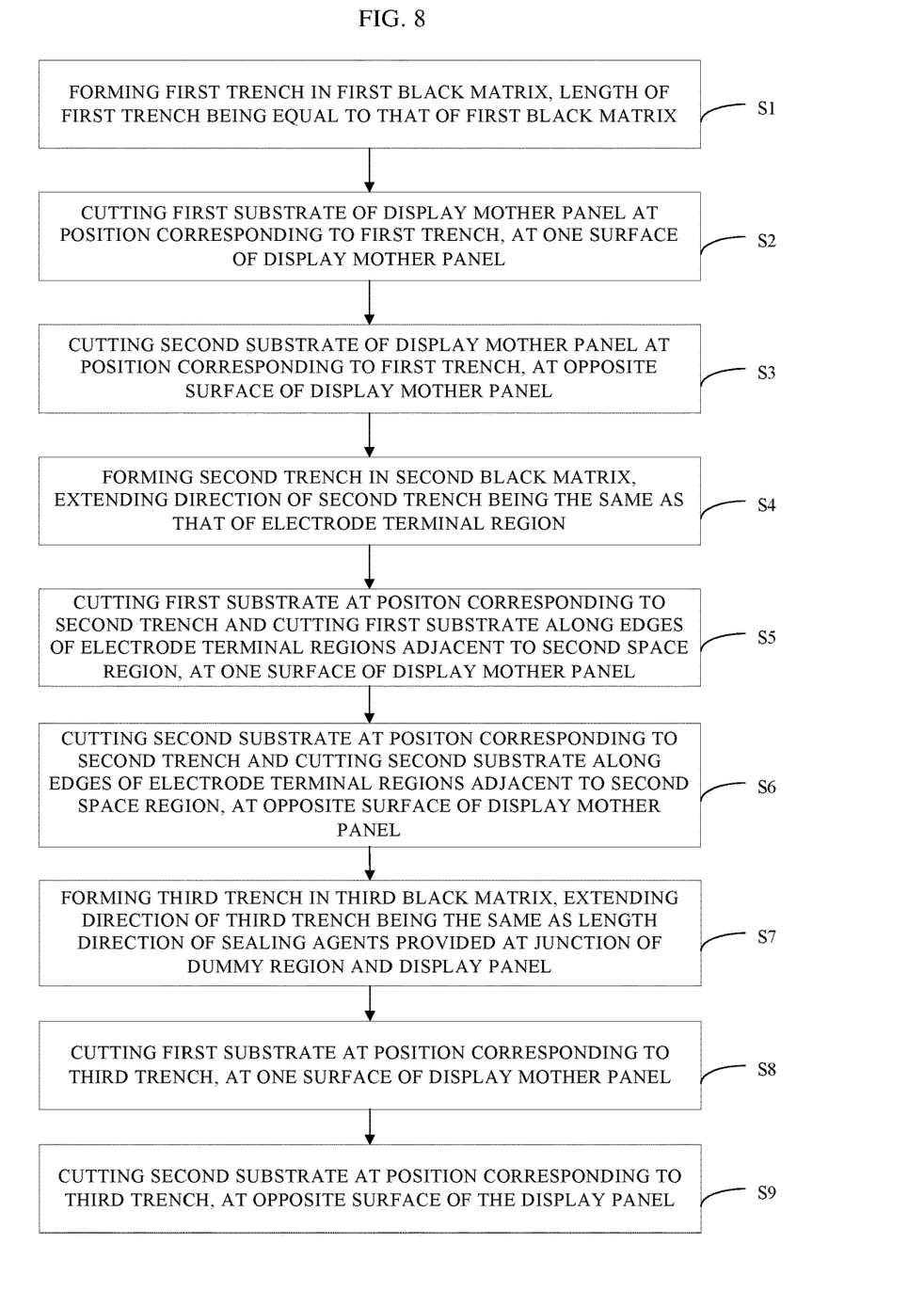
FIG. 8 is another flowchart of a cutting method according to the embodiments of the present invention.

According to another aspect of the present invention, as shown in FIGS. 7 and 8, the embodiments of the present invention provide a method of cutting the display mother panel, and the method comprises following steps S1 through S3.

In the step S1, the first trench is formed in the first black matrix, the length of the first trench is equal to that of the first black matrix.

In the step S2, a first substrate of the display mother panel is cut at a position corresponding to the first trench, at a side of the display mother panel.

In the step S3, a second substrate of the display mother panel is cut at a position corresponding to the first trench, at an opposite side of the display mother panel.

It should be understood that, although the first trench is formed in the first black matrix in the step S1, the cutting is not performed on the first substrate and the second substrate of the display mother panel in the step S1. Hereinafter, how to form the first trench in the black matrix without destroying the first substrate and the second substrate of the display mother panel will be described. The first trench formed below the first substrate facilitates the propagation of the cracks which are formed on the first substrate when the cutting is performed by using the mechanical cutter wheel, and facilitates the separation of the display mother panel along the cutting lines formed in the steps S2 and S3 by using relatively small pressure, after the steps S2 and S3.

After the step S1 is performed, the first trench with a certain width is formed on the sealing agent. Accordingly, after the steps S2 and S3 are performed, the display mother panel may be separated along the longitudinal direction by gently pressing the display panel, so that the display mother panel is divided into a plurality of parts. Since there is no cutting space remained on the display mother panel according to the embodiments of the present invention, the respective display panels of the display mother panel may have a larger display region and a narrower border. The display mother panel may be easily divided into the plurality of the display panels by using the method according to the embodiments of the present invention.

In the embodiment, projection of the cutting line formed in the step S2 on the second substrate may overlap with the cutting line formed in the step S3.

When cutting the display mother panels shown in FIGS. 3 and 4 by using the cutting method according to the embodiments of the present invention, the cutting may be performed along a midline L of the width of the sealing agent between the longitudinal edges of the two adjacent columns of the display panels. It should be understood that, as shown in the drawings, extending direction of the midline L is the same as the longitudinal direction of the display mother panel, and widths of the sealing agents at both sides of the midline L are equal to each other.

Hereinafter, the step S1 will be described. The first trench may be formed by using a laser cutting in the step S1. Laser beam is shown by down arrows in FIG. 5. Since thermal conductivity of material for forming the first black matrix is relatively low, an amount of heat transferred to the sealing agent is relatively small when forming the first trench by using the laser cutting, which may not produce much effect on liquid crystal. The first substrate and the second substrate of the display mother panel may not be affected when forming the first trench by cutting the first black matrix using the laser.

In the embodiments of the present invention, there is no limit to specific ways of cutting the first substrate and the second substrate, as long as a slit is formed at a position in the first substrate corresponding to the first trench, and a slit is formed at a position in the second substrate corresponding to the first trench, so as to separate the display mother panel by pressing the display mother panel. For example, the first substrate is cut by using a cutter wheel in the step S2, and/or the second substrate is cut by using a cutter wheel in the step S3. In the step S2, a depth of the crack formed by cutting the first substrate may be equal to a thickness of the first substrate, or may be smaller than the thickness of the first substrate; similarly, in the step S3, a depth of the crack formed by cutting the second substrate may be equal to a thickness of the second substrate, or may be smaller than the thickness of the second substrate, as long as the display mother panel can be separated along the midline L by gently pressing the display mother panel.

The method of cutting the display mother panel longitudinally is described above. Hereinafter, a method of cutting the display mother panel transversely will be described.

As described above, the display mother panel further comprises the plurality of the electrode terminal regions, and each display panel corresponds to one electrode terminal region. Generally, the electrode terminal region extends along the transverse direction of the display mother panel.

As described above, in the display mother panel according to the embodiments of the present invention, the electrode terminal regions may have two kinds of arrangement.

When the display mother panel shown in FIG. 3 is cut, as shown FIG. 7, the cutting method may further comprise following steps S4 and S5.

In the step S4, the display mother panel is cut along edges of the electrode terminal regions adjacent to the first space region (i.e., the outer edges of the electrode terminal regions after the cutting), at a side of the display mother panel.

In the step S5, the display mother panel is cut along the edges of the electrode terminal regions adjacent to the first space region (i.e., the outer edges of the electrode terminal regions after the cutting), at an opposite side of the display mother panel.

When cutting the display mother panel shown in FIG. 3, in the steps S4 and S5, the cutting line of the display mother panel is a cutting line M overlapping with the edges of the electrode terminal regions adjacent to the first space region.

When the display mother panel shown in FIG. 4 is cut, as shown in FIG. 8, the cutting method may further comprise following steps S4 through S6.

In the step S4, a second trench is formed in the second black matrix, and extending direction of the second trench is the same as that of the electrode terminal region.

In the step S5, at a side of the display mother panel, the first substrate is cut at a position corresponding to the second trench, and the first substrate is cut along edges of the electrode terminal regions adjacent to the second space region.

In the step S6, at an opposite side of the display mother panel, the second substrate is cut at a position corresponding to the second trench, and the second substrate is cut along the edges of the electrode terminal regions adjacent to the second space region.

It should be understood that, the "electrode terminal regions" in the steps S5 and S6 refer to all electrode terminal regions on the display mother panel. For example, when the display mother panel shown in FIG. 4 is cut, the first substrate and the second substrate of the display mother panel are required to be cut along the edges (i.e., a cutting line O in FIG. 4) of the third electrode region 320 and the fourth electrode region 420 adjacent to the second space region, and the first substrate and the second substrate of the display mother panel are also required to be cut along the edges of the electrode terminal regions corresponding to two display panels in next row, the edges (i.e., a cutting line P in FIG. 4) being adjacent to the second space region.

The second trench formed in the step S4 facilitates propagation of cracks that are formed when the cutting is performed in the step S5, and the display mother panel can be easily separated along the transverse direction after the step S6 is performed.

The display mother panel may be cut along a midline of width of the sealing agents of the two adjacent rows of the display panels, the sealing agents being formed integrally and extending transversely. Specifically, as shown FIG. 4, the sealing agents provided between transverse edges of a row of the display panels (including the first display panel 100 and the second display panel 200) and transverse edges of a next row of the display panels (including the third display panel 300 and the fourth display panel 400) are formed integrally, and the second trench formed in the second black matrix is provided on the midline N of width of the sealing agents which are formed integrally and extend transversely (the "on" herein refers to an upward direction when the display mother panel is placed on a horizontal plane and the display surface faces upward). After the second trench is formed, the first substrate is cut at a position of the first substrate corresponding to the midline N, and the second substrate is cut at a position of the second substrate corresponding to the midline N. In the embodiments, projection of the cutting line formed in the step S5 on the second substrate may overlap with the cutting line formed in the step S6.

The function of the second black matrix is similar to that of the first black matrix, and the method of forming the second trench in the second black matrix is similar to that of forming the first trench in the first black matrix, that is, the second trench may be formed by using a laser cutting in the step S4.

Hereinafter, a method of separating the dummy region from the display panel on the display mother panel will be described. In this case, the cutting method may further comprise following steps S7 through S9.

In the step S7, a third trench is formed in the third black matrix, and extending direction of the third trench is the same as length direction of the sealing agents provided at a junction of the dummy region and the display panel.

In the step S8, the first substrate is cut at a position corresponding to the third trench, at a side of the display mother panel.

In the step S9, the second substrate is cut at a position corresponding to the third trench, at an opposite side of the display panel.

In the embodiments, projection of the cutting line formed in the step S8 on the second substrate may overlap with the cutting line formed in the step S9.

The third trench formed below the first substrate facilitates propagation of cracks that are formed on the first substrate by a mechanical cutting, and the display mother panel can be separated along the cutting lines formed in the steps S12 and S13 by using relatively small pressure, after the steps S12 and S13 are performed.

The function of the third black matrix is similar to that of the first black matrix and the second black matrix, and the method of forming the third trench in the third black matrix is similar to that of forming the first trench in the first black matrix and forming the second trench in the second black matrix. Specifically, the third trench may be formed by using a laser cutting in the step S7.

It should be understood that, for convenience of description, although the various steps are marked with numbers and arrows in the present invention, the present invention is not limited strictly to execute the method according to the arrows and the order of numbers. For example, in the method shown in FIG. 8, the steps S1, S4 and S7 may be performed simultaneously, the steps S2, S5 and S8 may be performed simultaneously, and the steps S3, S6 and S9 may be performed simultaneously, that is, the first trench, the second trench and the third trench may be formed in one step, a surface of the display mother panel is cut in one step, and the other surface of the display mother panel is cut in one step. In other words, when a certain surface of the display mother panel is cut, all steps regarding the laser cutting may be performed in a single step, and all steps regarding the mechanical cutting may be performed in a single step.

Since the cutting spaces between two adjacent display panels are omitted in the display mother panel according to the embodiments of the present invention, the display regions of the display panels may be larger, so that display of large screen and narrow border can be achieved. The display mother panel can be easily cut by the cutting method according to the embodiments of the present invention.

It should be appreciated that the above embodiments are only the exemplary embodiments employed for illustrating the principle of the present invention, but the present invention is not limited thereto. It will be apparent to those skilled in the art that modifications and variations can be made without departing from the spirit and scope of the present invention, and these modifications and variations are also considered to fall within the scope of protection of the present invention.

The invention claimed is:

1. A method of cutting a display mother panel, the display mother panel being divided into a plurality of display panels, and sealing agents being provided around a display region of each display panel, wherein
the sealing agents provided between adjacent longitudinal edges of the display regions of two adjacent display panels in a same row are formed integrally, and an entire upper surface of the sealing agents provided between the adjacent longitudinal edges of the display regions of the two adjacent display panels is formed in a same plane, and
a first black matrix is provided on a whole of the entire upper surface formed in the same plane of the sealing agents provided between the adjacent longitudinal edges of the display regions of the two adjacent display panels, and the first black matrix completely covers the entire upper surface of the sealing agents provided between the adjacent longitudinal edges of the display regions of the two adjacent display panels without exposing the upper surface of the sealing agents,
the method comprising steps of:
forming a first trench in the first black matrix, a length of the first trench being equal to that of the first black matrix;

cutting a first substrate of the display mother panel at a position corresponding to the first trench, at a side of the display mother panel; and cutting a second substrate of the display mother panel at a position corresponding to the first trench, at an opposite side of the display mother panel.

2. The method of claim 1, wherein the first black matrix is formed integrally, and the first trench is formed by using a laser cutting.

3. The method of claim 1, wherein the display mother panel further comprises a plurality of electrode terminal regions, each display panel corresponds to one electrode terminal region, and a row of the display regions of the display panels are provided between two adjacent rows of electrode terminal regions; a sealing agent is provided at a side of the electrode terminal region close to the display region of the display panel corresponding to the electrode terminal region, and a first space region is provided at the other side of the electrode terminal region, the method further comprises steps of:

cutting the display mother panel along edges of the electrode terminal regions adjacent to the first space region, at a side of the display mother panel; and cutting the display mother panel along the edges of the electrode terminal regions adjacent to the first space region, at an opposite side of the display mother panel.

4. The method of claim 1, wherein the display mother panel further comprises a plurality of electrode terminal regions, each display panel corresponds to one electrode terminal region, the electrode terminal regions corresponding to one row of the display panels are provided at a side of the display regions of the one row of the display panels, and another row of the display panels are provided at the other side of the display regions of the one row of the display panels; the sealing agents provided between adjacent transverse edges of the display regions of two adjacent rows of the display panels are formed integrally, and a second black matrix is provided on the sealing agents provided between the adjacent transverse edges of the display regions of the two adjacent rows of the display panels; and a sealing agent is provided at a side of the electrode terminal region close to the display region of the display panel corresponding to the electrode terminal region, and a second space region is provided at the other side of the electrode terminal region, the method further comprises steps of:

forming a second trench in the second black matrix, a direction of extension of the second trench being the same as that of the electrode terminal region;

cutting the first substrate at a position corresponding to the second trench and cutting the first substrate along edges of the electrode terminal regions adjacent to the second space region, at a side of the display mother panel; and cutting the second substrate at a position corresponding to the second trench and cutting the second substrate along the edges of the electrode terminal regions adjacent to the second space region, at an opposite side of the display mother panel.

5. The method of claim 4, wherein the second black matrix is formed integrally, and the second trench is formed by using a laser cutting.

6. The method of claim 1, wherein the display mother panel further comprises a dummy region provided adjacent to at least one of the display panels, the dummy region comprises a sealing agent surrounding the dummy region, the sealing agents provided at a junction of the dummy region and the display panel are formed integrally, and a third black matrix is provided on the sealing agents provided at the junction of the dummy region and the display panel, the method further comprises steps of:

forming a third trench in the third black matrix, a direction of extension of the third trench being the same as a length direction of the sealing agents provided at the junction of the dummy region and the display panel;

cutting the first substrate at a position corresponding to the third trench, at a side of the display mother panel; and cutting the second substrate at a position corresponding to the third trench, at an opposite side of the display panel.

7. The method of claim 6, wherein the third black matrix is formed integrally, and the third trench is formed by using a laser cutting.

* * * * *